(12) United States Patent
Rho et al.

(10) Patent No.: US 7,755,733 B2
(45) Date of Patent: Jul. 13, 2010

(54) METHOD OF FORMING VERTICAL INORGANIC ALIGNMENT LAYER AND LIQUID CRYSTAL DISPLAY APPARATUS HAVING THE SAME

(75) Inventors: Soon-Joon Rho, Gyeonggi-do (KR); Hong-Koo Baik, Seoul (KR); Kyung-Chan Kim, Jeolabuk-do (KR); Jong-Bok Kim, Seoul (KR); Byoung-Har Hwang, Gyeonggi-do (KR); Han-Jin Ahn, Seoul (KR)

(73) Assignees: Samsung Electronics Co., Ltd. (KR); Industry-Academic Cooperation Foundation, Yonsai University (KR)

( * ) Notice: Subject to any disclaimer, the term of this patent is extended or adjusted under 35 U.S.C. 154(b) by 915 days.

(21) Appl. No.: 11/452,826

(22) Filed: Jun. 14, 2006

(65) Prior Publication Data
US 2007/0110920 A1   May 17, 2007

(30) Foreign Application Priority Data
Nov. 14, 2005   (KR)   ........................ 10-2005-0108711

(51) Int. Cl.
*G02F 1/1337*   (2006.01)
(52) U.S. Cl. .................................................... 349/125
(58) Field of Classification Search ................... 349/125
See application file for complete search history.

(56) References Cited

U.S. PATENT DOCUMENTS

| 5,662,965 | A | * | 9/1997 | Deguchi et al. | ......... | 427/249.14 |
| 2006/0249372 | A1 | * | 11/2006 | Xiang et al. | ........... | 204/192.11 |

FOREIGN PATENT DOCUMENTS

| JP | 2004-170744 | 6/2004 |
| JP | 2005-084146 | 3/2005 |
| JP | 2005181794 | 7/2005 |
| KR | 1020040052650 | 6/2004 |

\* cited by examiner

*Primary Examiner*—James A Dudek
(74) *Attorney, Agent, or Firm*—Cantor Colburn LLP

(57) ABSTRACT

A liquid crystal display apparatus includes a first display substrate, a second display substrate and a liquid crystal layer disposed therebetween. The first and second display substrates include first and second vertical inorganic alignment layers, respectively, to vertically align liquid crystal molecules of the liquid crystal layer. The first and second vertical inorganic alignment layers each include a silicon carbide and are formed on the first and second display substrates, respectively, by a chemical vapor deposition method or a sputtering method. Thus, processes for the vertical inorganic alignment layer may be simplified, thereby improving manufacturing productivity of the liquid crystal display apparatus.

7 Claims, 5 Drawing Sheets

METHOD OF FORMING VERTICAL INORGANIC ALIGNMENT LAYER AND LIQUID CRYSTAL DISPLAY APPARATUS HAVING THE SAME

This application claims priority to Korean Patent Application No. 2005-108711, filed on Nov. 14, 2005, and all the benefits accruing therefrom under 35 U.S.C. §119, and the contents of which in its entirety are herein incorporated by reference.

BACKGROUND OF THE INVENTION

1. Field of the Invention

The present invention relates to an alignment layer of a liquid crystal display apparatus. More particularly, the present invention relates to a method of forming a vertical inorganic alignment layer and a liquid crystal display apparatus having the same.

2. Description of the Related Art

In general, a liquid crystal display includes an array substrate, a color filter substrate and a liquid crystal layer. The liquid crystal layer includes a plurality of liquid crystal molecules and is disposed between the array substrate and the color filter substrate. The array substrate and the color filter substrate each include an alignment layer to align the liquid crystal molecules of the liquid crystal layer.

The alignment layer is classified as either a horizontal alignment layer or a vertical alignment layer. The horizontal alignment layer aligns the liquid crystal molecules to be aligned in a horizontal direction with respect to the substrates while a voltage is not applied to the liquid crystal layer. In contrast, the vertical alignment layer allows the liquid crystal molecules of the liquid crystal layer to be inclined relative to major surfaces of the substrates while the voltage is not applied to the liquid crystal layer.

In conventional alignment layers, the horizontal alignment layer and the vertical alignment layer include a polyimide-containing material. The vertical alignment layer is primarily formed through processes such as printing the polyimide-containing material on a process substrate, baking and curing the printed polyimide-containing material.

Recently, a size of the process substrate used for printing the polyimide-containing material has increased in order to reduce product costs. However, when the size of the process substrate increases, it is difficult to uniformly form the polyimide-containing material on the process substrate.

Further, a response speed of a patterned-vertical alignment mode liquid crystal display apparatus having the vertical alignment layer depends on a pre-tilting angle of the vertical alignment. However, when the vertical alignment layer includes the polyimide-containing material, the pre-tilting angle of the vertical alignment layer is not adjustable through the currently used processes to form the vertical alignment layer.

BRIEF SUMMARY OF THE INVENTION

The present invention provides a method suitable for forming a vertical inorganic alignment layer.

The present invention provides a liquid crystal display apparatus having the vertical inorganic alignment layer manufactured by the above method.

In one exemplary embodiment of the present invention, a method of forming a vertical inorganic alignment layer is provided as follows. A process substrate is disposed inside a process chamber. A silicon-containing gas and a carbon-containing gas are injected into the process chamber such that the silicon-containing gas and the carbon-containing gas react with each other. Thus, a vertical inorganic alignment layer comprising a silicon carbide is formed on the process substrate.

In another exemplary embodiment of the present invention, a method of forming a vertical inorganic alignment layer is provided as follows. A process substrate is disposed in a process chamber inside which a first target having a silicon-containing material and a second target having a carbon-containing material are disposed. A nonvolatile gas is injected into the process chamber. A power voltage is supplied to the first and second targets to activate the nonvolatile gas in a plasma state. Thus, the activated nonvolatile gas in the plasma state collides with the first and second targets such that silicon atoms and carbon atoms are discharged from the first and second targets, thereby forming a vertical inorganic alignment layer comprising a silicon carbide on the process substrate.

In still another exemplary embodiment of the present invention, a liquid crystal display apparatus includes a first display substrate, a second display substrate and a liquid crystal layer.

The first display substrate includes a first base substrate, a common electrode formed on the first base substrate and a first vertical inorganic alignment layer comprising a silicon carbide and formed on the common electrode. The second display substrate includes a second base substrate, a pixel electrode formed on the second base substrate and a second vertical inorganic alignment layer comprising the silicon carbide and formed on the pixel electrode. The liquid crystal layer is disposed between the first display substrate and the second display substrate.

According to the above, the vertical inorganic alignment layer includes the silicon carbide having the vertical alignment property and is formed on the process substrate by a chemical vapor deposition ("CVD") method or a sputtering method. Thus, the processes for the vertical inorganic alignment layer may be simplified, thereby improving manufacturing productivity of the liquid crystal display apparatus.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
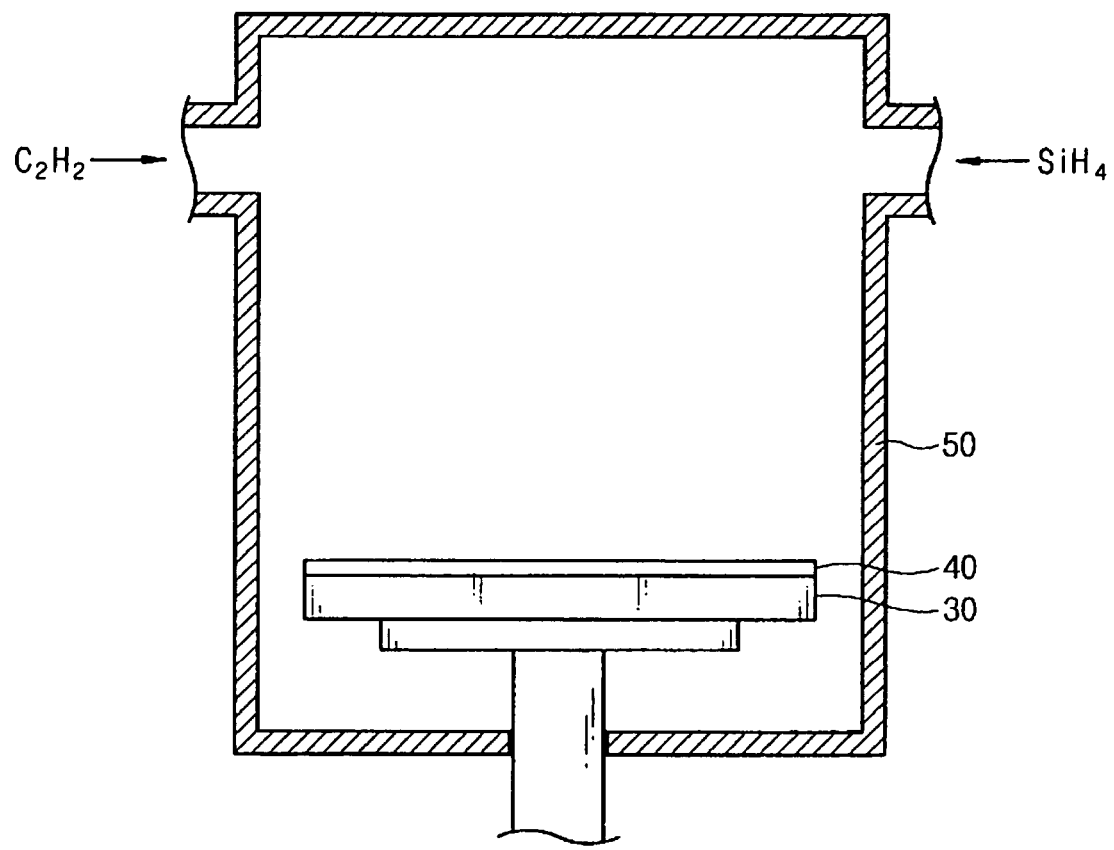
FIG. 1 is a cross-sectional view of a process chamber illustrating an exemplary embodiment of a process for forming a vertical inorganic alignment layer according to the present invention.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a cross-sectional view of a process chamber illustrating an exemplary embodiment of a process for forming a vertical inorganic alignment layer according to the present invention.

Referring to FIG. 1, a process substrate 30 heated at a predetermined temperature is located in a process chamber 50. Reaction gases such as a silicon-containing gas, a carbon-containing gas, etc., are injected into the process chamber 50. In the present exemplary embodiment, an example of the silicon-containing gas may include a silane gas ($SiH_4$) and an example of the carbon-containing gas may include an acetylene gas ($C_2H_2$) or a methane gas ($CH_4$).

When the reaction gases are chemically reacted with each other above the heated process substrate 30, a vertical inorganic alignment layer 40 comprising silicon carbide ($SiC_x$) having a vertical alignment property is formed on the process substrate 30.

In FIG. 1, a method of forming the vertical inorganic alignment layer 40 on the process substrate 30 through a chemical vapor deposition ("CVD") process using heat energy has been described. However, as another example of the present exemplary embodiment, the vertical inorganic alignment layer 40 may be formed on the process substrate 30 through a CVD process using plasma or light energy.

In the present exemplary embodiment, a composition ratio between carbon (C) and silicon (Si) in the vertical inorganic alignment layer 40 depends on a mixture ratio between the silicon-containing gas and the carbon-containing gas. An example of the silicon and the carbon of the vertical inorganic alignment layer 40 may have a composition ratio of about 1Si:0.5C to about 1Si:11C.

When a silicon-silicon bonding rate is over 35 percent among silicon bonds in the vertical inorganic alignment layer 40, the vertical inorganic alignment layer 40 may have the vertical alignment property without irradiating an ion beam. Table 1 represents a liquid crystal alignment state in accordance with the silicon-silicon bonding rate, and data represented by Table 1 has been measured by an X-ray Photoelectron Spectroscopy ("XPS").

TABLE 1

|  | Example 1 | Example 2 | Example 3 |
|---|---|---|---|
| Si—Si bonding rate | 0% | 5.84% | 39.63% |
| Liquid crystal alignment state | Not aligned | Not aligned | Vertically aligned |

As represented by Table 1, in the case of an example 1 where the silicon-silicon bonding rate is about 0% and an example 2 where the silicon-silicon bonding rate is about 5.84%, the liquid crystal molecules on the vertical inorganic alignment layer 40 are not vertically aligned. That is, when the silicon-silicon bonding rate is below 35% as in the examples 1 and 2, the inorganic alignment layer having the vertical alignment property has not been formed. However, in the case that the silicon-silicon bonding rate is over 35% as in example 3, the liquid crystal molecules are vertically aligned. That is, when the silicon-silicon bonding rate is over 35%, the inorganic alignment layer having the vertical alignment property has been formed.

In order to adjust a pretilt angle of the vertical inorganic alignment layer 40, an ion beam is irradiated onto a surface of the vertical inorganic alignment layer 40. In the present exemplary embodiment, an example of the pretilt angle of the vertical inorganic alignment layer 40 is from about 67 degrees to about 90 degrees. Also, the ion beam has an incidence angle from about 45 degrees to about 90 degrees and an ion beam energy from about 100 eV to about 700 eV.

Figure 2:
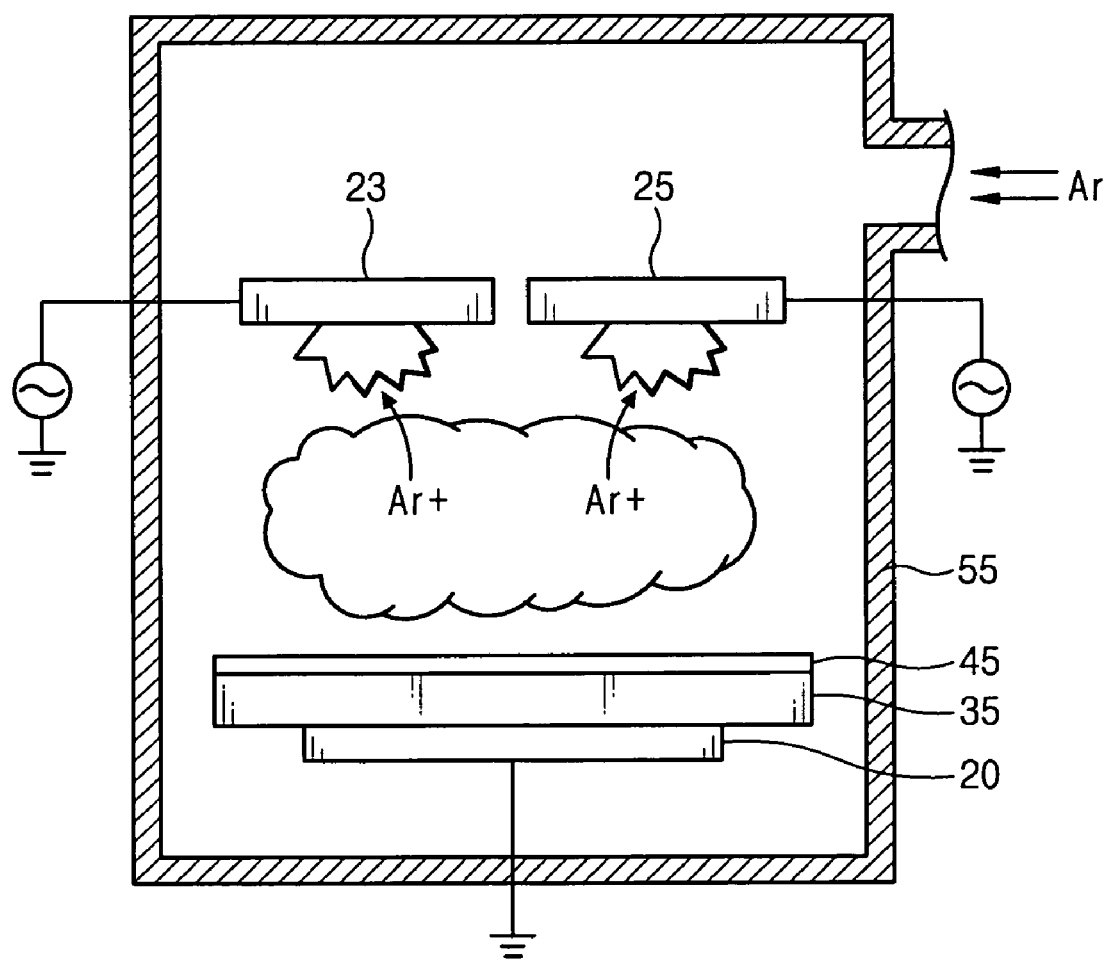
FIG. 2 is a cross-sectional view of the process chamber of FIG. 1 illustrating another exemplary embodiment of a process for forming a vertical inorganic alignment layer according to the present invention.

FIG. 2 is a cross-sectional of a process chamber view illustrating another exemplary embodiment of a process for forming a vertical inorganic alignment layer according to the present invention.

Referring to FIG. 2, a process chamber 55 is maintained in a vacuum state. The process chamber 55 includes a supporter 20 supporting a process substrate 35, a first target 23 including a silicon-containing material and a second target 25 including a carbon-containing material. The process substrate 35 is transferred into the process chamber 55 and disposed on the supporter 20. In the present embodiment, a ground voltage is applied to the process substrate 35, and a first radio frequency power and a second radio frequency power are applied to the first and second targets 23 and 25, respectively.

As a nonvolatile gas, an argon gas (Ar) is injected into the process chamber 55. The argon gas (Ar) collides with electrons discharged from the first and second targets 23 and 25, so that the argon gas (Ar) is excited into argon ions (Ar+). The argon ions (Ar+) collide with the first and second targets 23 and 25. When the argon ions (Ar+) collide with the first and second targets 23 and 25, silicon atoms and carbon atoms are discharged from the first and second targets 23 and 25, respectively. The silicon atoms and the carbon atoms are coupled to each other, and the coupled atoms are coated on the process substrate 35 as a thin film. Thus, a vertical inorganic alignment layer 45 comprising silicon carbide (SiCx) having a vertical alignment property is formed on the process substrate 30.

In the present exemplary embodiment, the vertical inorganic alignment layer 45 may have the vertical alignment property when a hydrogen concentration rate in the vertical inorganic alignment layer 45 comprising the silicon carbide (SiCx) is below 30%.

Table 2 represents a liquid crystal alignment state in accordance with the hydrogen concentration rate in the argon gas (Ar).

TABLE 2

|  | Example 1 | Example 2 | Example 3 |
| --- | --- | --- | --- |
| H2/(Ar + H2) | 0% | 26% | 40% |
| Liquid crystal alignment state | Vertically aligned | Not aligned vertically | Not aligned vertically |

As represented by Table 2, in the case of example 1 where the nonvolatile gas includes only argon gas (Ar), the liquid crystal molecules are vertically aligned by the vertical inorganic alignment layer 45. However, in the case of examples 2 and 3 where the nonvolatile gas includes the argon gas (Ar) and the hydrogen substance (H2), the liquid crystal molecules are not vertically aligned. Thus, in order to form the vertical inorganic alignment layer 45 that vertically aligns the liquid crystal molecules, it is preferred that the hydrogen substance (H2) in the argon gas (Ar) injected into the process chamber 55 is reduced.

In the present exemplary embodiment, a composition ratio between carbon (C) and silicon (Si) in the vertical inorganic alignment layer 45 depends on intensities of the first and second radio frequency powers.

Figure 3:
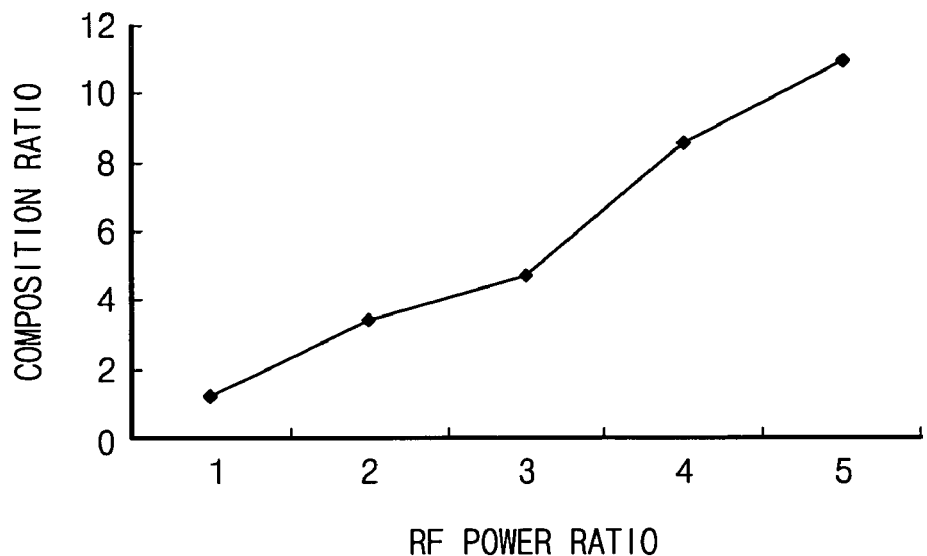
FIG. 3 is a graph showing a composition ratio of the silicon carbide in accordance with a radio frequency power ratio.

FIG. 3 is a graph showing a composition ratio of the silicon carbide in accordance with a radio frequency power ratio.

In FIG. 3, an x-axis and an y-axis indicate the radio frequency power ratio and the composition ratio of the silicon carbide, respectively. Also, the radio frequency power ratio means a ratio of the second radio frequency power applied to the second target 25 to the first radio frequency power applied to the first target 23, and the composition ratio of the silicon carbide means a ratio of the carbon to the silicon.

Referring to FIG. 3, when the radio frequency power ratio gradually increases from 1:0.5 to 1:5, the composition ratio of the silicon carbide gradually increases from 1:0.5 to 1:11.

Table 3 represents a liquid crystal alignment state in accordance with the radio frequency power ratio.

TABLE 1

| | RF power ratio | | | | |
| --- | --- | --- | --- | --- | --- |
| | 1:1 | 1:2 | 1:3 | 1:4 | 1:5 |
| Liquid crystal alignment state | Vertically aligned | Vertically aligned | Vertically aligned | Vertically aligned | Vertically aligned |

As represented by Table 3, in the case that the radio frequency power ratio is 1:1, 1:2, 1:3, 1:4 or 1:5, the liquid crystal molecules are vertically aligned. Thus, when the composition ratio is in a range from 1:0.5 to 1:11, the liquid crystal molecules may be vertically aligned.

Figure 4:
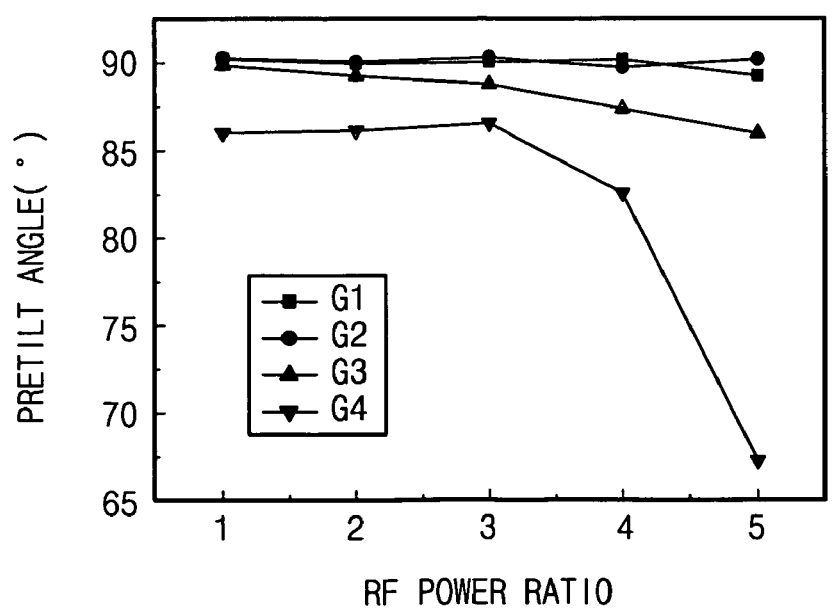
FIG. 4 is a graph showing a pretilt angle of the liquid crystal molecules in accordance with the radio frequency power ratio.

FIG. 4 is a graph showing a pretilt angle of the liquid crystal molecules in accordance with the radio frequency power ratio. In FIG. 4, an x-axis and a y-axis indicate the radio frequency power ratio and the pretilt angle of the liquid crystal molecules, respectively.

Referring to FIG. 4, a first graph G1 indicates a pretilt angle of the liquid crystal molecules in accordance with the radio frequency power ratio when the ion beam is not irradiated onto the vertical inorganic alignment layer 45, and a second graph G2 indicates the pretilt angle of the liquid crystal molecules in accordance with the radio frequency ratio when the ion beam is irradiated onto the vertical inorganic alignment layer 45 at about 80 degrees. Also, a third graph G3 indicates the pretilt angle of the liquid crystal molecules in accordance with the radio frequency power ratio when the ion beam is irradiated onto the vertical inorganic alignment layer 45 at about 60 degrees, and a fourth graph G4 indicates the pretilt angle of the liquid crystal molecules in accordance with the radio frequency power ratio when the ion beam is irradiated onto the vertical inorganic alignment layer 45 at about 45 degrees.

As indicated by the first, second, third and fourth graphs G1, G2, G3 and G4, when the ion beam is not irradiated or the ion beam is irradiated at a range from about 90 degrees to about 45 degrees while the radio frequency power ratio is in a range from 1:1 to 1:5, the pretilt angle is indicated at a range from about 90 degrees to about 65 degrees. That is, when the radio frequency power ratio is in a range from 1:1 to 1:5, the liquid crystal molecules may be vertically aligned and the pretilt angle of the liquid crystal molecules may be maintained over 65 degrees suitable for vertically aligning the liquid crystal molecules. Thus, when the vertical inorganic alignment layer 45 is formed by a sputtering method, it is preferred that the ratio between the first and second radio frequency powers applied to the first and second targets 23 and 25, respectively, is maintained in a range from 1:1 to 1:5.

Figure 5:
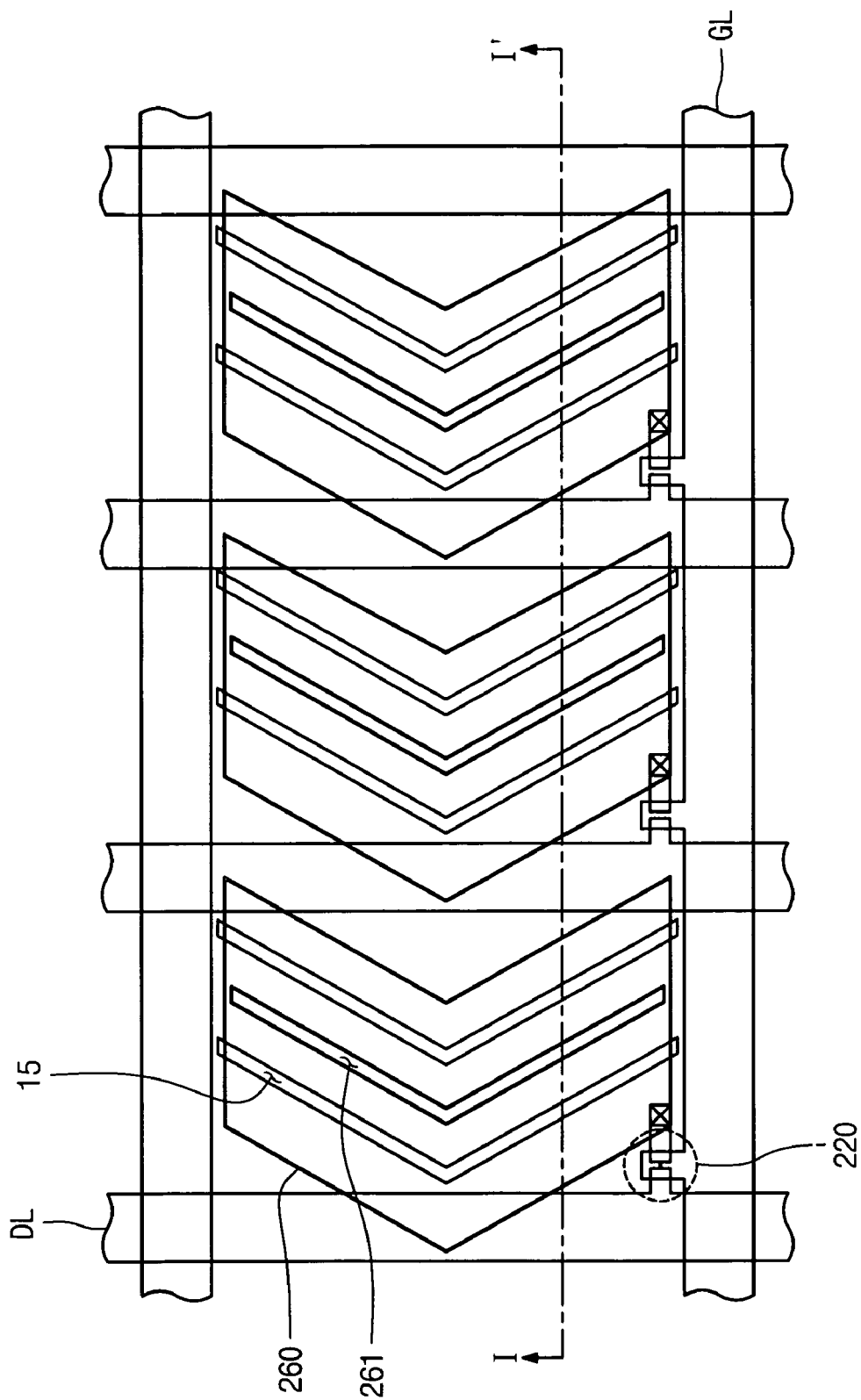
FIG. 5 is a plan view showing another exemplary embodiment of a patterned vertical alignment liquid crystal display apparatus according to the present invention.
Figure 6:
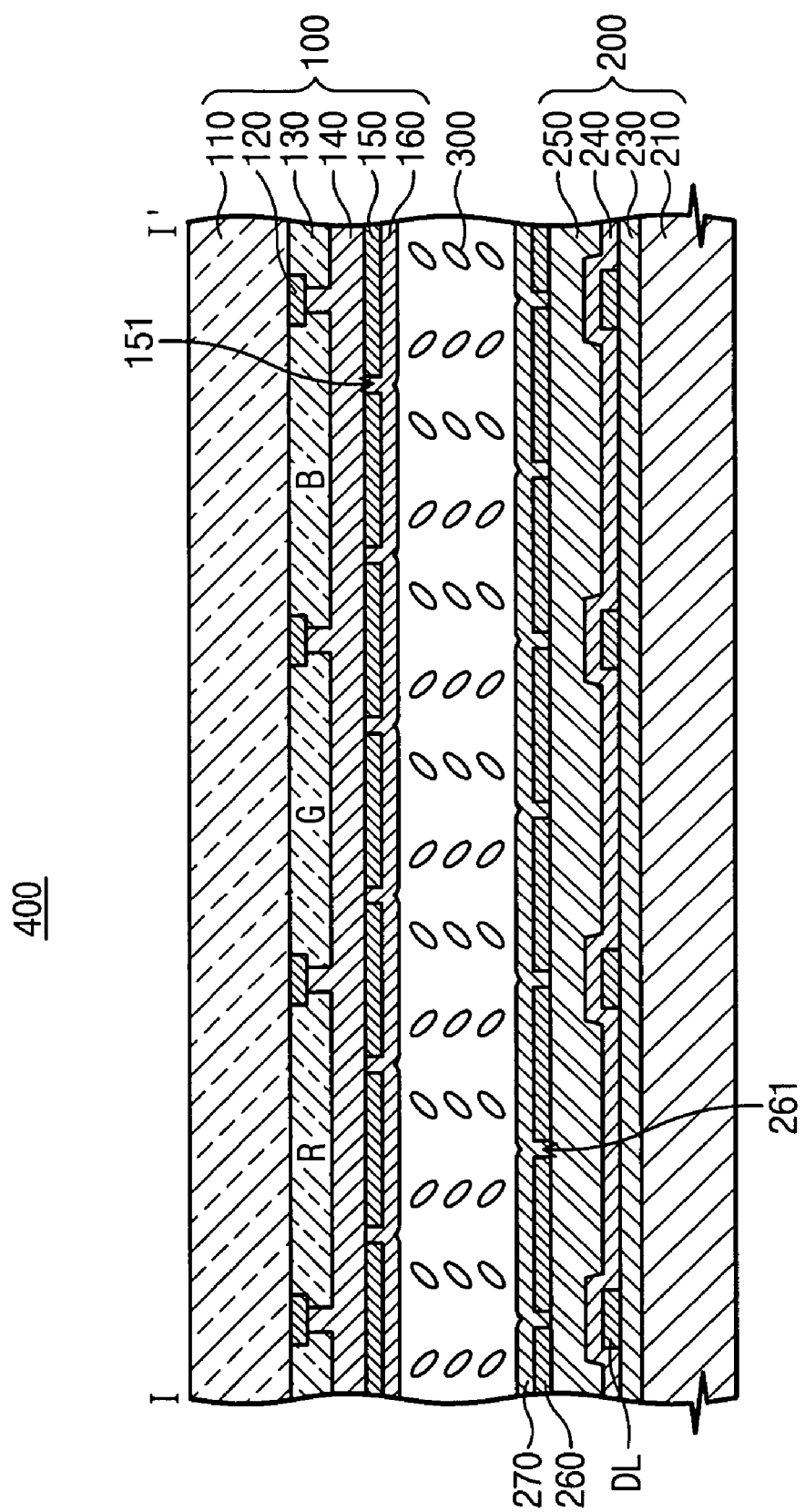
FIG. 6 is a cross-sectional view taken along line I-I' of FIG. 5.

FIG. 5 is a plan view showing another exemplary embodiment of a patterned vertical alignment liquid crystal display apparatus according to the present invention. FIG. 6 is a cross-sectional view taken along line I-I' of FIG. 5.

Referring to FIGS. 5 and 6, a liquid crystal display apparatus 400 includes a color filter substrate 100, an array substrate 200 facing the color filter substrate 100 and a liquid crystal layer 300 disposed between the color filter substrate 100 and the array substrate 200.

The color filter substrate 100 includes a first base substrate 110, a black matrix 120, a color filter layer 130, a common electrode 150 and a first vertical inorganic alignment layer 160.

The black matrix 120 is formed on the first base substrate 110. The color filter layer 130 includes a red color pixel R, a green color pixel G and a blue color pixel B. The color filter layer 130 is formed on the first base substrate 110 and adjacent to the black matrix 120.

An overcoating layer 140 is further formed over the black matrix 120 and the color filter layer 130. The overcoating layer 140 may reduce a step-difference between the black matrix 120 and the color filter layer 130 to planarize a surface of the color filter substrate 100.

The common electrode 150 is formed on the overcoating layer 140. The common electrode 150 is partially removed to form a first opening 151 through which the overcoating layer 140 is exposed. In the present exemplary embodiment, the first opening 151 has a V shape similar to the V shape of pixel electrodes 260 in FIG. 5.

The first vertical inorganic alignment layer 160 includes the silicon carbide (SiCx) and is formed on the common electrode 150 through the processes as shown in FIGS. 1 and 2.

The array substrate 200 includes a second base substrate 210, a gate line GL, a data line DL, a thin film transistor 220, a pixel electrode 260 and a second vertical inorganic alignment layer 270.

The gate line GL and the data line DL are formed on the second base substrate 210 and intersect each other. The gate line GL and the data line DL are electrically insulated from each other by a gate insulation layer 230. The gate line GL and the data line DL receive a gate signal and a data signal, respectively.

The thin film transistor 220 and the pixel electrode 260 are formed in a pixel region defined by the gate line GL and the data line DL. The thin film transistor 220 is insulated from the gate line GL and the data line DL. Particularly, the thin film transistor 220 includes a gate electrode electrically connected to the gate line GL, a source electrode electrically connected to the data line DL and a drain electrode electrically connected to the pixel electrode 260. Thus, the thin film transistor 220 provides the pixel electrode 260 with the data signal in response to the gate signal.

The pixel electrode 260 has a V shape, and a bending portion or vertex portion of the pixel electrode 260 partially overlaps the data line DL. Also, the pixel electrode 260 is partially removed to form a second opening 261 through a center portion of the pixel electrode 260.

In the present exemplary embodiment, the second opening 261 formed through the pixel electrode 260 is positioned at a position corresponding to a position between two first openings 151 formed through the common electrode 150. Due to the first and second openings 151 and 261, the pixel region of the liquid crystal display apparatus 400 is divided into domains each which has a different liquid crystal alignment direction from each other.

The second vertical inorganic alignment layer 270 includes the silicon carbide (SiCx) and is formed on the pixel electrode 260 through the processes as shown in FIGS. 1 and 2. The liquid crystal molecules of the liquid crystal layer 300 may be vertically aligned during a black state by the first and second vertical inorganic alignment layers 160 and 170.

When the array substrate 200 is completed, the liquid crystal is dropped onto the array substrate 200. Then, the color filter substrate 100 is combined with the array substrate 200, thereby forming the liquid crystal layer 300 between the color filter substrate 100 and the array substrate 200.

When an electric field is applied between the pixel electrode 260 and the common electrode 150 of the liquid crystal display apparatus 400, the liquid crystal molecules of the liquid crystal layer 300 are aligned in a different direction in accordance with the domains. Thus, the liquid crystal display apparatus 400 may control a light transmittance using the liquid crystal molecules aligned in the different direction to display an image, to thereby improve a viewing angle of the liquid crystal display apparatus 400.

Although not shown in FIGS. 5 and 6, since the liquid crystal display apparatus 400 employs the liquid crystal that is not self-emissive, the liquid crystal display apparatus 400 further includes a backlight assembly. The backlight assembly is disposed under the display panel to provide light to the display panel. Thus, the liquid crystal display apparatus 400 may display the image using the light of which a transmittance is controlled by the liquid crystal layer 300.

According to the above, the vertical inorganic alignment layer comprising the silicon carbide having the vertical alignment property is formed on the process substrate by either the CVD method or the sputtering method.

Thus, the processes that form the vertical inorganic alignment layer may be simplified since various processes such as a baking process, a curing process, etc., may be omitted. As a result, manufacturing productivity of the liquid crystal display apparatus having the vertical inorganic alignment layer may be improved.

Further, when the vertical inorganic alignment layer is formed by the sputtering method, the first and second radio frequency powers applied to the first and second targets, respectively, may be controlled, thereby adjusting the pretilt angle of the vertical inorganic alignment layer and improving the response speed of the liquid crystal display apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of forming a vertical inorganic alignment layer, the method comprising:
   disposing a process substrate in a process chamber inside which a first target having a silicon-containing material and a second target having a carbon-containing material are disposed;
   injecting a nonvolatile gas into the process chamber;
   supplying a power voltage to the first and second targets to activate the nonvolatile gas in a plasma state,
   wherein the activated nonvolatile gas in the plasma state collides with the first and second targets such that silicon atoms and carbon atoms are discharged from the first and second targets, respectively, thereby forming the vertical inorganic alignment layer comprising a silicon carbide on the process substrate, and
   irradiating an ion beam onto a surface of the vertical inorganic alignment layer to adjust a pretilt angle of the vertical inorganic alignment layer.

2. The method of claim 1, wherein a composition ratio between the silicon and the carbon in the vertical inorganic alignment layer is in a range from about 1:0.5 to about 1:11.

3. The method of claim 2, wherein a ground voltage is applied to the process substrate, a first radio frequency power and a second radio frequency power are applied to the first and second targets, respectively, and the composition ratio between the silicon and the carbon in the silicon carbide depends on an intensity of the first and second radio frequency powers.

4. The method of claim 1, wherein the nonvolatile gas comprises an argon gas.

5. The method of claim 1, wherein a hydrogen concentration rate in the vertical inorganic alignment layer is below about 30%.

6. The method of claim 1, wherein the ion beam has an incidence angle from about 45 degrees to about 90 degrees relative to the surface of the vertical inorganic alignment layer.

7. The method of claim 1, wherein the pretilt angle is from about 67 degrees to about 90 degrees.

* * * * *